United States Patent [19]

Pesto et al.

[11] 4,410,850
[45] Oct. 18, 1983

[54] WATER-COMPENSATED OPEN FAULT LOCATOR

[75] Inventors: William S. Pesto, Alpharetta; William C. Reed, Lilburn, both of Ga.

[73] Assignee: Bell Telephone Laboratories, Incorporated, Murray Hill, N.J.

[21] Appl. No.: 312,096

[22] Filed: Oct. 16, 1981

[51] Int. Cl.³ .................... G01R 31/08; H04B 3/46
[52] U.S. Cl. ............................ 324/52; 179/175.3 F
[58] Field of Search .................... 324/52, 61 R; 179/175.3 R, 175.3 F

[56] References Cited

U.S. PATENT DOCUMENTS

| 2,932,970 | 4/1960 | Zito | 324/61 R |
| 3,234,459 | 2/1966 | Brazee | 324/52 |
| 3,248,646 | 4/1966 | Brazee | 324/52 |

OTHER PUBLICATIONS

Maloney: "Locating Cable Faults"-IEEE Trans. on Industry Appl.-vol. IA-9, No. 4-Jul. 1973-pp. 380-394.

Primary Examiner—Ernest F. Karlsen
Assistant Examiner—Jose M. Solis
Attorney, Agent, or Firm—J. T. Peoples

[57] ABSTRACT

Apparatus, and associated methodology, for testing an open in a pair from a shielded, multipair cable contaminated by water to correct the measured distance to the open from a measurement point and thereby obtain the true distance comprises: means (501) for applying an AC source (100) to the mate (101) of the open conductor (102); means (503,504) for detecting the resultant voltage induced on the open conductor through the capacitive coupling effects of the pair; and means (510) for determining the percentage length of the pair affected by water from the source and resultant voltages and for estimating the true distance by correcting the measured distance as a function of this percentage.

6 Claims, 4 Drawing Figures

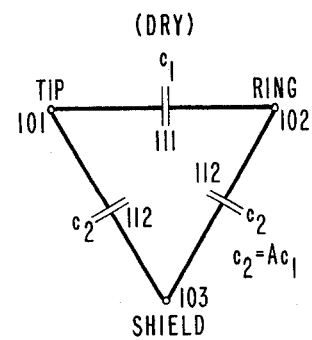
FIG. 1 (DRY)
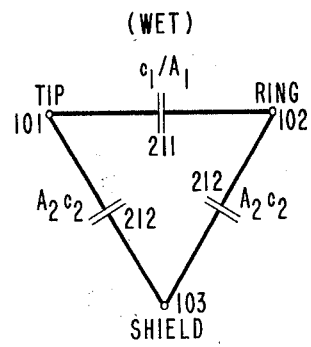
FIG. 2 (WET)
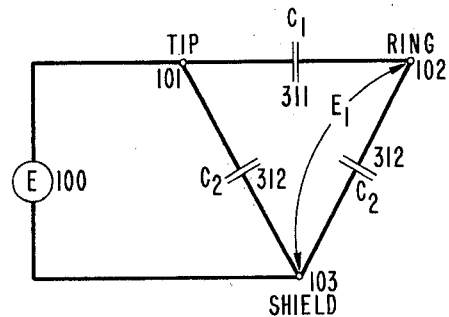
FIG. 3

WATER-COMPENSATED OPEN FAULT LOCATOR

TECHNICAL FIELD

This invention relates generally to testing a multipair cable for faults and, more particularly, to circuitry and associated methodology for locating an open in a cable pair affected by water contamination.

BACKGROUND OF THE INVENTION

In telecommunications systems, the end portions of the link between subscriber premises are typically served by multipair cable. This form of communication medium typically comprises numerous conductors arranged as twisted pairs which are encompassed by a protective sheath. The sheath generally includes a continuous metallic layer surrounding the core which affords electrical and mechanical protection to the pairs and, additionally, defines the electrical transmission properties of the pairs. The integrity of the sheath may be broken in a number of ways. For instance, an undetected defect may arise during manufacture or, more commonly, during usage. Oftentimes, a buried or underground cable is subject to lightning strokes which may introduce pinholes in the sheathing. If a defectively sheathed cable is utilized in an environment wherein water ingress to the core may occur, the problem of locating other faults affecting the pairs is compounded. For example, a pair may be rendered defective at a point geographically removed from the point of water contamination; the pair defects may include opens, shorts, grounds and so forth.

Regarding opens, testing techniques presently utilized by cable maintenance and repair personnel for locating opens in cables measure either (i) capacitance-to-ground of the open conductor accessed at a convenient test point with the other conductor of the pair grounded at the test point, or (ii) the mutual capacitance of the pair at the point of access. If the pair being measured is completely dry, such a measurement yields the distance to the open conductor or conductors with an accuracy of a few percent. However, if the cable is wet, error will be introduced and it may range up to a few hundred percent for a completely saturated section. Since it is not usually known or even suspected that water may be present in cable sections, huge measurement errors might be experienced with a concomitant increase in the time needed to locate conductor breaks.

Besides the conventional capacitance measurements to determine conductor lengths, other pertinent art relates to testing for the presence of water in cable for rehabilitation or replacement. Thus, the sole purpose of this type of testing is that of determining the need for replacing certain sections of cable. This is in contrast to the general problem addressed herein of determining the distance to an open not resulting from water migration and located at a point remote to the water-filled section or sections.

The test sequence utilized to determine the presence of water for rehabilitation purposes requires that two measurements be made on a pair, namely, (i) an open-circuited mutual capacitance measurement to yield a so-called "capacitive length," and (ii) a short-circuited DC resistance measurement to yield a so-called "resistive length." The ratio of capacitive length to resistive length is computed, and this ratio is plotted on a preexisting graph which depicts "ratio" versus "% water in cable." Thus, the procedure requires a compilation of a set of reference graphs based on cable types as well as a set of two-ended measurements. Such a technique proves cumbersome and does not provide sufficient information to locate an open.

SUMMARY OF THE INVENTION

The prior art shortcomings, deficiencies and limitations are alleviated, in accordance with the present invention, by open fault locating circuitry, and associated methodology, that locates open conductors along cable pairs in the presence of wet cable sections.

Broadly speaking, the methodology requires one, single-ended measurement to be performed on the faulty pair. Basically, a voltage is impressed between the longer wire of the pair and shield, and the resultant voltage between the shorter wire and shield is detected. The ratio of detected-to-source voltage is formed, and this ratio is used in a bilinear transform relationship to compute the percentage of the total cable length affected by water. The bilinear transform constants are determined by the gauge of the cable under test. Once the percentage factor is evaluated, it may be used to correct the measured distance, obtained from conventional measurements, to yield an estimate of the true distance to the open.

The organization and operation of this invention will be better understood from a consideration of the detailed description of an illustrative embodiment thereof, which follows, when taken in conjunction with the accompanying drawing.

BRIEF DESCRIPTION OF THE DRAWING

FIG. 1 depicts a lumped, three-wire model of a cable pair from a shielded, multipair cable in the dry state;

FIG. 2 depicts a three-wire model of the same cable pair of FIG. 1 as modified to account for the presence of water in the cable;

FIG. 3 depicts a lumped, three-wire model of a cable pair having wet and dry sections and illustrating the connection point for the source voltage and detection point for the voltage resulting from the imposition of the source.

DETAILED DESCRIPTION

Figure 4:
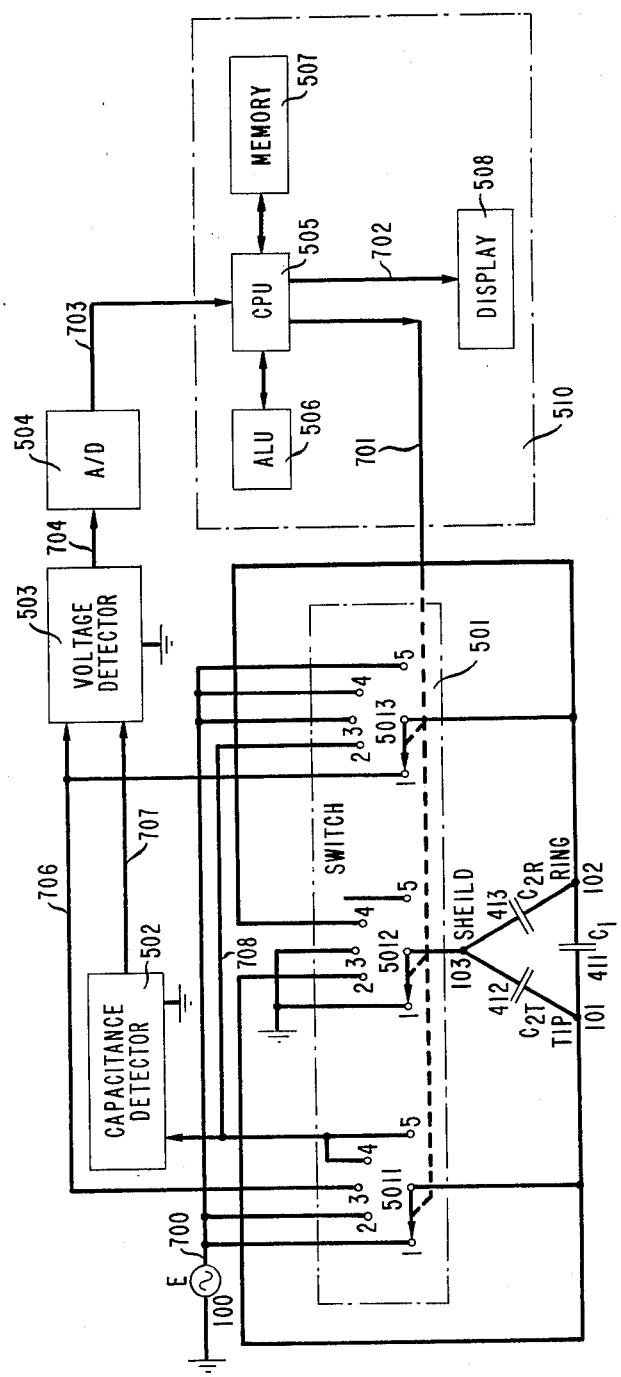
FIG. 4 shows an illustrative embodiment of a circuit arrangement designed in accordance with the present invention.

Before describing an illustrative embodiment of the present invention, it is helpful to first consider a theoretical basis for the teachings of the invention. This basis provides valuable insight and allows for full elucidation of the subject matter of the invention.

1. Theoretical Basis

Water entering a cable core comes into contact with the cable shield. The shield is typically a continuous, metallic layer which is utilized to mechanically and electrically protect the conductors comprising the core. In the low frequency range (up to a few kilohertz) the conductivity of the water present within the core produces an effective shield which migrates with the water as it fills the core. In particular, as the water moves to encompass a conductor pair, the conductor-to-shield capacitance of each individual conductor increases. As the water moves between the conductors, the direct capacitance between the wires of the pair decreases since the water acts as a grounded shield. For example, with one type of air-core, 19 gauge polyetheylene insulated conductor (PIC) cable, it may be shown that the direct capacitance in the wet state decreases by a factor of 5.0 over the direct capacitance in the dry state, whereas the capacitance-to-ground increases by a factor of 4.1 between dry and wet states. Similarly, for a corresponding type of 22 gauge air-core, PIC cable, the factors become 5.1 and 4.1, respectively.

These capacitance relationships are summarized in the cable pair models depicted in FIGS. 1 and 2. In FIG. 1, the conventional three-wire model of a cable pair and shield is shown for the cable in the dry state. In particular, conductors 101 and 102 represent the TIP and RING conductors of the pair, respectively, and conductor 103 is the effective electrical shield. Capacitor 111, having a value $c_1$, represents the direct capacitance per unit length of cable, expressed typically in microfarads per mile. Capacitor 112, having a value $c_2$ represents the capacitance-to-ground per unit length of each conductor; the pair is presumed symmetrical and the units of $c_2$ correspond to that of $c_1$. In the dry state, $c_2$ is related to $c_1$ via the relation $c_2 = A\, c_1$. Typically, A is 2.4 for the standard air-core PIC gauges, that is, 19,22,24 and 26 gauge cables.

FIG. 2 again depicts the conventional three-wire model for the cable pair, but the element values now represent those resulting from water contamination. In particular, the direct capacitance per unit length is now designated $c_1/A_1$ and is represented by element 211. As discussed above, $A_1$ is 5.0 for 19 gauge cable and 5.1 for 22 gauge cable. The capacitance-to-ground is now designated $A_2\, c_2$ and is represented by element 212; for 19 or 22 gauge cables, $A_2$ is typically 4.1. The apparent gauge sensitivity exhibited by these values is primarily due to design and maintenance considerations along the cable route rather than differences in cable gauges comprising the route.

The models of FIGS. 1 and 2 depicts the extreme conditions—dry or wet—that may occur within a cable. Attention is now focused on combining the models of FIGS. 1 and 2 to develop a model for the total direct and conductor-to-ground capacitances of cable pairs wherein the cable is only partially filled with water.

The capacitance of a pair in a cable partially contaminated with water may be considered to be comprised of a number of wet and dry sections joined in parallel. Since the sections are in parallel, the distribution of wet sections along the cable does not affect the total capacitance measured from one or the other end points. Thus, all the wet sections are gathered to one end of the cable and all the dry sections are arranged at the opposite end. The total cable is presumed to be of length L and the wet sections are of length w. The percentage length, P, of cable filled with water is then $$P = 100w/L. \quad (1)$$

The total direct capacitance, designated $C_1$, may be computed from the per unit length models of FIGS. 1 and 2 to yield $$C_1 = c_1 w/A_1 + c_1(L-w). \quad (2)$$

The total capacitance of one conductor-to-ground, designated $C_2$, may also be obtained by combining the models of FIGS. 1 and 2 to yield $$C_2 = A_2 c_2 w + c_2(L-w). \quad (3)$$

Also, as discussed above, in the dry state $$c_2 = A c_1. \quad (4)$$

In equations (1) through (4), since the gauge is presumed to be given and once the length is determined, that is, A, $A_1$, $A_2$ and L are known, there remains only one unknown, namely w (or P). The value of this unknown may be estimated via an end-point measurement on the cable pair under test. The type of measurement to be made is depicted in FIG. 3. Actually, two types of open conductor conditions are represented by the network of FIG. 3, namely, (i) an open in only one conductor, or (ii) an open in both conductors. In the latter situation, source 100 may be applied to either the TIP or RING. However, in the former situation (i), source 100 must be connected to the so-called "good" wire of the pair, that is, the nonfaulted conductor. Otherwise, the conductor-to-shield coupling beyond the single open would yield erroneous results. In FIG. 3, it is presumed that TIP conductor 101 is the good wire. (A technique for determining which wire is the good wire will be discussed shortly.) Voltage source 100, of strength E, is a low frequency AC signal chosen so that only capacitive effects are measured. A frequency of 1000 Hz is a typical measurement frequency. From FIG. 3, it is apparent that $$E_1/E = C_1/(C_1 + C_2). \quad (5)$$

If $E_1/E$ is defined to be a ratio, R, then equations (1) through (5) may be solved to yield $$R = \frac{(1 - A_1)P + 100A_1}{[(1 - A_1) + AA_1(A_2 - 1)]P + 100A_1(1 + A)}. \quad (6)$$

Equation (6) may be rearranged to obtain the bilinear transform relation $$P = \frac{-100A_1[1 + (A - 1)R]}{[(A_1 - 1) + AA_1(1 - A_2)]R + (1 - A_1)}. \quad (7)$$

From equation (7), the percentage length of cable contaminated by water may be obtained. Knowing P, it now becomes possible to correct a measured distance to a fault and estimate the true electrical distance to the fault. The discrepancy between the measured and true distances, of course, is caused by the distorting effects of the water.

Attention is first focused on correcting a measurement on a pair with only one conductor open, and then the case of both conductors open at a point is treated.

1.1 Single Conductor Faults

Single conductor fault locating techniques usually employ a conductor-to-shield measurement of capacitance between the faulted wire and shield with the good wire shorted to shield. This capacitance is designated $C_g$, and from FIG. 3, it is apparent that $$C_g = C_1 + C_2. \quad (8)$$

Open fault locators are calibrated to read directly the distance, typically in feet, to the open. This distance is proportional to $C_g$, and the constant of proportionality is gauge dependent. The concern here is not with determining the constant of proportionally (a problem that must be treated whether or not water is present), but rather lies in correcting the measured distance to obtain the true distance given a known the proportionality constant.

From equations (2) and (3), it is seen that $C_g$ is linearly related to w, and via equation (1), linearly to P. This implies that the measured distance, designated M, to an open will increase linearly with the percentage length of cable filled with water and will reach a value G times the true distance, designate T, for P=100%. This relation may be expressed as $$M/T=(G-1)P/100+1, \qquad (9)$$

where G is gauge dependent. For example, G=2.95 for 24 gauge air-core, PIC cable so that when P=100%, the measured distance is 2.95 times the true distance to the fault.

1.2 Double Conductor Faults or Pair Length

These types of fault locating techniques generally employ a mutual capacitance measurement of the capacitance between the TIP and RING conductors. This capacitance is designated $C_m$, and from FIG. 3, it is apparent that $$C_m = C_1 + C_2/2. \qquad (10)$$

From equations (1), (2) and (3) it is again seen that $C_m$ is linearly related to w and P. This implies that the measured distance, again designated M, to the end of the pair will increase linearly with the percentage length of cable filled with water and will reach a value B times the true distance T for P=100%. This relation may be expressed as $$M/T=(B-1)P/100+1, \qquad (11)$$

where B is gauge dependent. For example, B=2.32 for 24 gauge air-core, PIC cable so that when P=100%, the measured distance is 2.32 times the true distance to the pair open.

1.3 Summary of Theoretical Basis

The presence of water is automatically sensed, its amount and effect calculated and an estimate of the true distance to one-sided or two-sided opens is obtained by a single-ended measurement. Basically, a voltage source E is connected between one wire of the pair and shield, and the resultant voltage $E_1$ between the other wire and shield is detected. The ratio of the detected to source voltages ($R=E_1/E$) is then used in an expression of the bilinear form (see equation (7))

$$P=(K_1R+K_2)/(K_3R+K_4), \qquad (12)$$

to yield the percentage of the total length of cable containing water. Once this percentage is obtained, the measured distance M to the fault may be corrected to yield an estimate to the true electrical distance T according to the relation (see equation (9) or (11))

$$T=M/(K_5P+1). \qquad (13)$$

The value of each $K_i$, i=1,2, ..., 5 is gauge dependent, and $K_5$ for a mutual capacitance measurement (B) is different than the value of a capacitance-to-ground (G) measurement. While these factors are gauge dependent, to first order, one set of factors may suffice for the common air-core PIC cables, that is, 19,22,24 and 26 gauge cables.

2. Illustrative Embodiment

FIG. 4 depicts, partially in schematic form and partly in block diagram form, an illustrative embodiment of a water-compensated open fault locator. In FIG. 4, the particular pair under test is shown in its three-wire model form wherein conductors 101 and 102 represent the TIP and RING, respectively, and conductor 103 represents the SHIELD. The TIP, RING and SHIELD are connected to measuring circuitry by means of switch 501, which basically comprises three ganged switches 5011, 5012 and 5013. Each switch 5011, 5012 and 5013 may be switched to one of five different positions. In particular, switch 5011 has its common point connected to TIP conductor 101. With switch 5011 in positions 1 or 2, the TIP is connected to source 100 via lead 700, whereas in position 3 it connects to voltage detector 503 via lead 706, and in positions 4 and 5, the TIP connects to capacitance detector 502 via lead 708. Referring now to switch 5013, which has its common point connected to RING conductor 102, positions 3, 4 or 5 are used to couple source 100 to the RING via lead 700, whereas positions 1 and 2 interconnect the RING with voltage detector 503 via lead 706 and capacitance detector 502 via lead 708, respectively. Finally, switch 5012 has its common point connected to SHIELD 103 and positions 1 and 3 ground the SHIELD, whereas positions 2 and 4 connect the SHIELD to the TIP and RING, respectively. Switch 501, which is controlled by central processing unit (CPU) 505, allows for five different measurements to be performed on the cable pair, namely:

(1) the ratio R formed by (i) dividing the voltage detected on the RING as a result of applying source 100 to the TIP with (ii) the voltage E of source 100;

(2) the capacitance $C_{gr}=C_1+C_{2R}$, where $C_{gr}$ represents the RING-to-SHIELD total capacitance, $C_{2R}$ is the RING-to-SHIELD direct capacitance and $C_1$, as before, is the direct RING-to-TIP capacitance;

(3) the ratio R formed by (i) dividing the voltage detected on the TIP as a result of applying source 100 to the RING with (ii) the voltage E of source 100;

(4) the capacitance $C_{gT}=C_1+C_{2T}$, where $C_{gT}$ represents the TIP-to-SHIELD total capacitance and $C_{2T}$ is the TIP-to-SHIELD direct capacitance; and (5) the mutual capacitance $$C_m = C_1 + \frac{C_{2R} C_{2T}}{C_{2R} + C_{2T}}.$$

The numbers identifying the measurement list correspond to the various positions of switches 5011, 5012 and 5013.

Capacitance detector 502 is a conventional capacitance measuring circuit and voltage detector 503 is basically a rectifier. The output of capacitance detector 502 serves as an input to voltage detector 503 via lead 707; the output of voltage detector 503 connects to analog-to-digital (A/D) converter 504 via lead 704.

The remainder of the measurement circuit comprises digital processor 510 having CPU 505, arithmetic logic unit (ALU) 506, memory 507 and display 508 as its elements. Processor 510 receives, via lead 703, digital values which represent the digitized voltage levels produced by detector 503. These values may be stored, mathematically manipulated or displayed. Display 508 indicates the length of the cable conductor, or pair length depending on the test, directly in feet.

To perform a water-compensated length measurement, the ratio R is first measured. This is accomplished with switch 501 in position 1 or in position 3, depending on which conductor is open. The appropriate capacitance is then measured: $C_{gR}$ with switch 501 in position 2, $C_{gT}$ with position 4 or $C_m$ with position 5 selected. Processor 510, which has information about gauge and total length stored in memory 507, corrects the measured quantity with the aid of equations (12) and (13) to obtain an estimate of the true length. Thus, processor 510 performs the required control functions to select the appropriate measurements and then processes the data to produce a displayed output indicative of the true distance to the open.

To further exemplify the method in making a typical length measurement on a open conductor, the steps are as follows (the number in parenthesis is the position of switch 501):

(a) Measure $C_{gT}$ and store (4);
(b) Measure $C_{gR}$ and store (2);
(c) Compare $C_{gT}$ with $C_{gR}$ and select smaller (say $C_{gT}$ for this example);
(d) Measure R on TIP and store (3);
(e) Select gauge, calculate $$P = \frac{K_1 R + K_2}{K_3 R + K_4} \text{ and store;}$$

(f) Calculate $M = C_{gT} \times$ Scale Factor, where Scale Factor is the length per unit capacitance of dry cable;
(g) Calculate $T = M(K_5 P + 1)$.

When measuring the length of a pair having one conductor open, ratio R must be measured by applying the voltage to the nonfaulted conductor. This implies that it first must be known which conductor is open. To accomplish this, the test for capacitance is made on both conductors, one at a time (steps (a) and (b) above). The smaller of these measurements indicates which conductor is open (step (c) above). The appropriate ratio R is then measured based on the three prior steps.

It is to be further understood that the open fault locator testing arrangement, and associated methodology, described herein is not limited to specific forms disclosed by way of example and illustration, but may assume other embodiments limited only by the scope of the appended claims.

What is claimed is:

1. Apparatus for measuring the distance (M) between a test location and an open in at least one conductor (101 or 102) of a pair contained within a multipair, shielded (103) cable contaminated with water and for modifying said measured distance to obtain the true distance (T) between said location and said open, said apparatus characterized by an alternating current source (100) having a preselected voltage value (E),
means (501) for applying said source between the mate (102 or 101) of said at least one wire and said shield at said test location,
means (503,504) for detecting the resultant voltage ($E_1$) at said test location between said at least one wire and said shield in response to said source and the capacitive coupling effects of said pair,
means (504,510), coupled to said means for detecting, for determining the percentage (P) length of cable affected by said water from said preselected voltage and said resultant voltage, and
means (501), responsive to said means for determining, for estimating said true distance by correcting said measured distance as a function of said percentage.

2. Apparatus for estimating the true distance (T) between a test location and an open in at least one conductor (101 or 101 and 102) from a pair (101,102) in a shielded (103) cable contaminated by water, said apparatus of the type having a first operational mode for estimating said true distance whenever only one of said conductors is open and a second operational mode for estimating said true distance whenever both of said conductors are open and wherein in said first operational mode, said apparatus comprises a source (100) and means (501-504,510) for measuring the capacitance ($C_{gT}$ or $C_{gR}$) between said open conductor and said shield with the other of said conductors connected to said shield, and
in said second operational mode, said apparatus comprises said source and means (501-504,510) for measuring the total capacitance ($C_m$) of said pair, said apparatus further characterized by in said first operational mode, means (501) for applying said source (E) between said other conductor and said shield and means (503,504) for detecting the resultant voltage ($E_1$) on said open conductor, and
in said second operational mode, means (501) for applying said source (E) between either one of said conductors and said shield and means (503,504) for detecting resultant voltage ($E_1$) on the other one of said conductors, and
in either said first or second mode, means (504,510), coupled to said means for detecting, for determining the percentage (P) length of cable affected by said water from said source and said resultant voltage and means (510), responsive to said means for determining, for estimating said true distance by correcting said measured capacitance as a function of said percentage.

3. Apparatus as recited in claims 1 or 2 wherein said means for determining evaluates said percentage according to the relation $$P = \frac{K_1(E_1/E) + K_2}{K_3(E_1/E) + K_4}, \text{ and}$$

and said function is of the form $$T = M/(K_5 P + 1),$$

where $K_i$, $i = 1, \ldots, 5$ are predetermined parameters dependent on the gauge of said pair.

4. A method for estimating the true electrical distance (T) between a test point and an open along one wire (102) of a wet pair in a shielded (103) cable, said method comprising the steps of applying a predetermined voltage (E) at said test point between the mate (101) of said one wire and said shield,
detecting the resultant voltage ($E_1$) at said test point between said one wire and said shield in response to said predetermined voltage,
determining the percentage (P) of the total length of said wet pair affected by water from the values of said predetermined voltage and said resultant voltage, measuring the capacitance ($C_{gR}$) between said one wire and said shield with said mate connected to said shield to provide a measured electrical distance (M), and correcting said measured distance as a function of said percentage to obtain said true distance.

5. A method for approximating the true electrical distance (T) between a test location and an open in one wire (102) of a wet pair from a shielded (103) cable, said method comprising the steps of energizing the good wire (101) of said pair with an AC source (E) referenced to said shield at said test location, measuring the voltage ($E_1$) induced on said one wire with respect to said shield at said test location, computing the percentage (P) of the total length of said pair affected by water as $$P = \frac{K_1(E_1/E) + K_2}{K_3(E_1/E) + K_4},$$

wherein $K_i$, i=1, 2, 3, 4 are dependent on the gauge of said pair, measuring the capacitance ($C_{gT}$) between said one wire and said shield with said good wire connected to said shield to provide a measured electrical distance (M), and correcting said measured distance to obtain said true distance according to the relation $T = M/(K_5P + 1)$ where $K_5$ is gauge dependent.

6. A method for approximating the true distance (T) to an open fault from one end of a wet shielded (103) cable, said method of the type wherein the mutual capacitance ($C_m$) of a chosen pair having a first (101) and second (102) conductor is measured to generate a measured distance (M), characterized in that said method further comprises the steps of:

applying a predetermined voltage (E) between said first conductor and said shield;

detecting the resultant voltage ($E_1$) between said second conductor and said shield in response to said applied voltage, determining the percentage (P) of water in the cable from the values of said applied voltage and said resultant voltage, and factoring said percentage in said measured distance to estimate said true distance.

* * * * *